(12) United States Patent
Tomabechi

(10) Patent No.: US 8,962,409 B2
(45) Date of Patent: Feb. 24, 2015

(54) SEMICONDUCTOR DEVICE AND FABRICATION METHOD

(75) Inventor: Shuichi Tomabechi, Atsugi (JP)

(73) Assignee: Transphorm Japan, Inc., Yokohama (JP)

( * ) Notice: Subject to any disclaimer, the term of this patent is extended or adjusted under 35 U.S.C. 154(b) by 0 days.

(21) Appl. No.: 13/569,536

(22) Filed: Aug. 8, 2012

(65) Prior Publication Data

US 2013/0075788 A1    Mar. 28, 2013

(30) Foreign Application Priority Data

Sep. 28, 2011    (JP) .................................. 2011-213471

(51) Int. Cl.
| | | |
|---|---|---|
| H01L 21/337 | (2006.01) | |
| H01L 29/778 | (2006.01) | |
| H01L 29/66 | (2006.01) | |
| H01L 29/10 | (2006.01) | |
| H01L 29/20 | (2006.01) | |

(52) U.S. Cl.
CPC ...... *H01L 29/7787* (2013.01); *H01L 29/66462* (2013.01); *H01L 29/1029* (2013.01); *H01L 29/2003* (2013.01)
USPC ............ 438/191; 257/E29.249; 257/E29.252; 257/194

(58) Field of Classification Search
USPC .................. 438/191; 257/167, 172, 192, 194, 257/E21.409, E29.059, E29.119, E29.242, 257/E29.249, E29.252
See application file for complete search history.

(56) References Cited

U.S. PATENT DOCUMENTS

| | | | |
|---|---|---|---|
| 2006/0108606 A1* | 5/2006 | Saxler et al. .................. | 257/200 |
| 2007/0164315 A1 | 7/2007 | Smith et al. | |
| 2007/0164322 A1* | 7/2007 | Smith et al. .................. | 257/256 |
| 2008/0087915 A1 | 4/2008 | Uemoto | |
| 2010/0270591 A1 | 10/2010 | Ahn | |
| 2012/0193637 A1* | 8/2012 | Kalnitsky et al. ............... | 257/76 |

FOREIGN PATENT DOCUMENTS

| | | |
|---|---|---|
| JP | 2002-359256 A1 | 12/2002 |
| JP | 2008-98434 A1 | 4/2008 |
| TW | 200520409 A | 6/2005 |

OTHER PUBLICATIONS

Taiwanese Office Action from corresponding Taiwanese Application No. 101128759, 12 pages.

* cited by examiner

*Primary Examiner* — Benjamin Sandvik
*Assistant Examiner* — Leslie Pilar Cruz
(74) *Attorney, Agent, or Firm* — Fish & Richardson P.C.

(57) ABSTRACT

A method for fabricating a semiconductor device is disclosed. The method includes sequentially forming a first semiconductor layer, a second semiconductor layer and a semiconductor cap layer containing a p-type impurity element on a substrate, forming a dielectric layer having an opening after the forming of the semiconductor cap layer, forming a third semiconductor layer containing a p-type impurity element on the semiconductor cap layer exposed from the opening of the dielectric layer, and forming a gate electrode on the third semiconductor layer.

8 Claims, 12 Drawing Sheets

SEMICONDUCTOR DEVICE AND FABRICATION METHOD

CROSS-REFERENCE TO RELATED APPLICATION

This patent application is based upon, and claims the benefit of priority of Japanese Patent Application No. 2011-213471 filed on Sep. 28, 2011, the entire contents of which are incorporated herein by reference.

FIELD

The embodiments discussed herein relate to a semiconductor device and a fabrication method.

BACKGROUND

A nitride semiconductor such as gallium nitride (GaN), aluminum nitride (AlN), and indium nitride (InN), or a material composed of a mixed crystal of GaN, AlN and InN generally has a wide band gap. These materials are utilized as a high-power electronic device, a short-wavelength light emitting device or the like. Among these, a technology associated with a field-effect transistor (FET), in particular, a high electron mobility transistor (HEMT) has been developed as a high-power device (e.g., Patent Document 1). A high electron mobility transistor (HEMT) including a nitride semiconductor may be utilized for a high-power and high-efficiency amplifier, a high-power switching device, and the like.

The HEMT having a nitride semiconductor generally includes an aluminum gallium nitride/gallium nitride (AlGaN/GaN) heterostructure formed on a substrate, in which a GaN layer serves as an electron transit layer. Note that the substrate may be formed of sapphire, silicon carbide (SiC), gallium nitride (GaN), silicon (Si), and the like.

The GaN, which is a kind of the nitride semiconductor, includes a high saturation electron velocity or a wide band gap. Hence, the GaN may be able to acquire superior pressure resistance and exhibit excellent electric characteristics. Further, the GaN is polarized in a [0 0 0 1] direction parallel to a c-axis (wurtzite form). Accordingly, when the AlGaN/GaN heterostructure is formed, piezoelectric polarization may be induced by lattice strain due to the difference in the lattice constant between the AlGaN and GaN. As a result, highly-concentrated two-dimensional electron gas (2DEG) may be generated near an interface of the GaN layer.

More specifically, an example of a related art HEMT is described with reference to FIG. 1. The HEMT having a structure of FIG. 1 includes an (AlN) buffer layer 912, an i-AlGaN buffer layer 913, an electron transit layer 914, and an electron donation layer 915 formed on a substrate 911. The HEMT further includes a gate electrode 921, a source electrode 922 and a drain electrode 923 on the electron donation layer 915. With such a structure, 2DEG 914a may be generated in the electron transit layer 914 near the interface between the i-GaN forming the electron transit layer 914 and the i-AlGaN forming the electron donation layer 915.

From the standpoint of safety, it is preferable that power devices such as the high-power and high-efficiency amplifier or the high-power switching device have normally-off characteristics capable of shutting off electric current flow when the bias is at a zero voltage. However, in the related art example illustrated in FIG. 1, the 2DEG generated at the interface includes high concentration of electrons. Hence, a negative bias may need to be applied to the gate electrode 921 for shutting of the electric current flow. Accordingly, the device utilizing the GaN may achieve a low on-resistance exceeding the limitation of a device utilizing Si. However, it may be difficult for the device utilizing the GaN to be applied to an inverter as a power device.

Hence, in order for the HEMT having the AlGaN/GaN heterostructure to be in a normally-off status, it may be necessary to shift a threshold voltage to a positive side by decreasing electrons of the 2DEG 914a directly beneath the gate electrode 921. The threshold voltage may be shifted to the positive side by controlling the generation of the 2DEG electrons based on the polarization effect obtained by thinning the AlGaN film or decreasing Al composition. However, with the above methods, on-resistance may be increased with the decrease of the 2DEG electrons.

Further, as a method for causing the HEMT having the AlGaN/GaN heterostructure to be in a normally-off status, there is disclosed the HEMT having the AlGaN/GaN heterostructure having a p-GaN layer layered directly beneath the gate electrode (e.g., Patent Document 2). In this structure, the concentration of the 2DEG electrons in the electron transit layer may be decreased due to the holes injected from the p-GaN layer directly beneath the gate electrode. Accordingly, the threshold voltage may be shifted to the positive side to cause the HEMT having the AlGaN/GaN heterostructure to be in a normally-off status without increasing the on-resistance.

RELATED ART DOCUMENT

Patent Document 1: Japanese Laid-open Patent Publication No. 2002-359256
Patent Document 2: Japanese Laid-open Patent Publication No. 2008-98434

In order for the HEMT having the AlGaN/GaN heterostructure having the p-GaN layer to be in a normally-off status without increasing the on-resistance, it may be important to generate numerous holes in a region of the p-GaN layer directly beneath the gate electrode. In general, the p-GaN layer is formed by a magnesium-doped (Mg-doped) GaN layer grown by metal organic vapor phase epitaxy (MOVPE). However, Mg within the GaN layer is bonded with hydrogen, and hence, the Mg within the GaN layer immediately after the growth is not electrically active to generate holes. Accordingly, heat treatment is generally conducted on the Mg-doped GaN layer under a nitrogen atmosphere to eliminate hydrogen from the GaN layer, which may activate the Mg within the GaN layer to become a p-type. However, even if an attempt has been made to form the Mg-doped GaN layer such that only a region of the Mg-doped GaN layer directly beneath the gate electrode is activated while allowing other regions to remain inactivated, the boundary between the activated region and the inactivated region may fluctuate due to a heating condition or the like. Accordingly, the yield of the fabricated HEMT may be lowered, and the uniformity of the fabricated HEMT may be lowered. Specifically, the above results may appear significant when thickness of the Mg-doped GaN layer is increased for securing a normally-off status of the Mg-doped GaN.

Further, the crystal structure of the GaN is a hexagonal wurtzite structure, which lacks inversion symmetry in the c-axis direction. Hence, the GaN exhibits spontaneous polarization. Further, the GaN exhibits the piezoelectric polarization when the crystal structure is strained. Accordingly, the GaN may generate an internal field. The internal field is known as being stronger than the electric field generated by doping an impurity element. In general, a surface of the GaN layer is a Ga surface. Hence, the surface of the GaN layer includes negative piezoelectric charges and a rear surface of the GaN layer includes a positive electric layer in Ga stabilization surface growth. Accordingly, it may be difficult for hydrogen (protons) to pass through in the surface direction due to the effect of the internal field. This may lower the activation rate of the Mg, which makes it difficult to generate holes. As a result, it may be difficult for the Mg-doped GaN layer to be in a normally-off status.

Accordingly, it may be desirable to provide a fabrication method and a semiconductor device utilizing a nitride semiconductor such as GaN or the like as a semiconductor material, which may be capable of exhibiting high uniformity and the normally-off status without increasing the on-resistance.

SUMMARY

According to an aspect of the embodiments, there is provided a method for fabricating a semiconductor device. The method includes sequentially forming a first semiconductor layer, a second semiconductor layer and a semiconductor cap layer containing a p-type impurity element on a substrate; forming a dielectric layer having an opening after the forming of the semiconductor cap layer; forming a third semiconductor layer containing a p-type impurity element on the semiconductor cap layer exposed from the opening of the dielectric layer; and forming a gate electrode on the third semiconductor layer.

The object and advantages of the invention will be realized and attained by means of the elements and combinations particularly pointed out in the appended claims.

It is to be understood that both the foregoing general description and the following detailed description are exemplary and explanatory and are not restrictive of the invention.

Additional objects and advantages of the embodiments will be set forth in part in the description which follows, and in part will be obvious from the description, or may be learned by practice of the invention.

DESCRIPTION OF EMBODIMENTS

Figure 1:
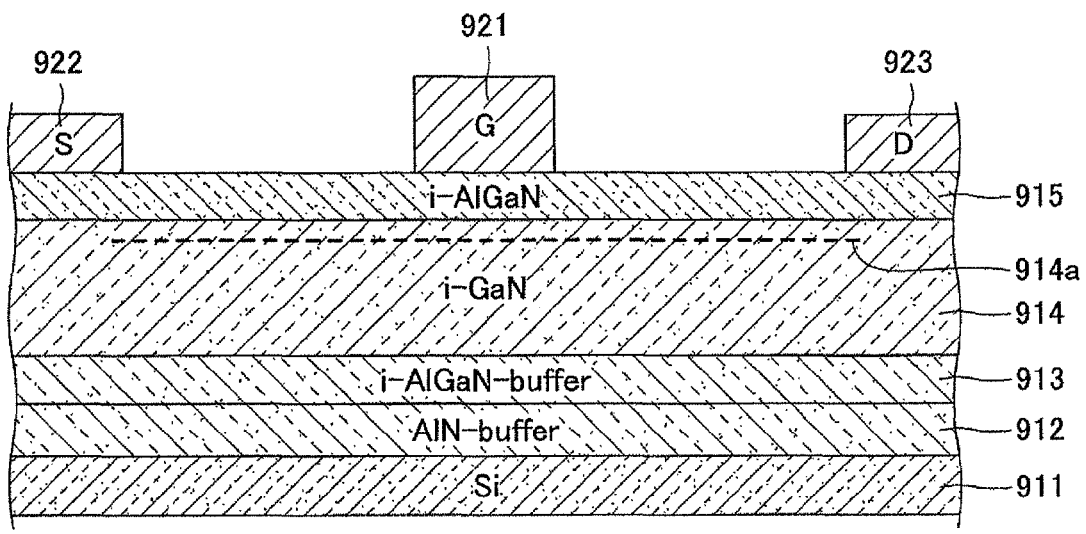
FIG. 1 is a structural diagram illustrating a related art high electron mobility transistor (HEMT) utilizing GaN.

In the following, preferred embodiments are described with reference to the accompanying drawings. Note that identical components are provided with the same reference numerals and repeated descriptions of the same components are omitted.

First Embodiment

Semiconductor Device

Figure 2:
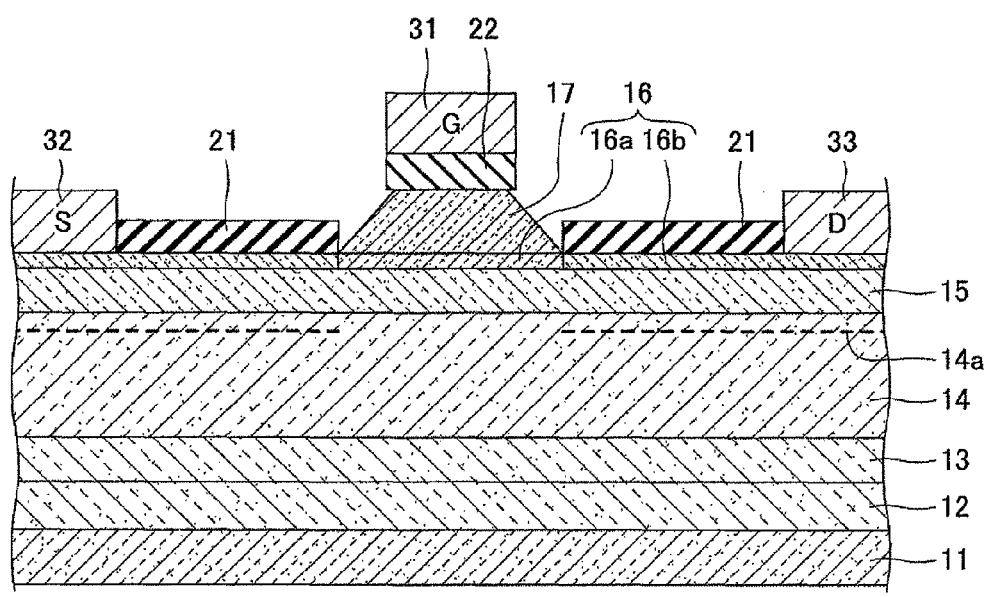
FIG. 2 is a structural diagram illustrating a semiconductor device according to a first embodiment.

A semiconductor device according to a first embodiment is described with reference to FIG. 2. The semiconductor device according to the first embodiment includes a first buffer layer 12, a second buffer layer 13, an electron transit layer 14 serving as a first semiconductor layer, an electron donation layer 15 serving as a second semiconductor layer and a lower Mg-doped GaN layer 16, which are sequentially formed on a substrate 11. Note that the lower Mg-doped GaN layer 16 serving as a semiconductor cap layer is formed of a p-type impurity-doped nitride semiconductor layer. An upper Mg-doped GaN layer 17 is formed of a p-type impurity-doped nitride semiconductor layer and serves as the third semiconductor layer. The upper Mg-doped GaN layer 17 is formed on the lower Mg-doped GaN layer 16 directly beneath the gate electrode 31. Further, a dielectric layer 21 is formed in a region of the lower Mg-doped GaN layer 16 excluding a region of the lower Mg-doped GaN layer 16 in which the upper Mg-doped GaN layer 17 is formed. The gate electrode 31 is formed on the upper Mg-doped GaN layer 17 via an insulating film 22. The source electrode 32 and the drain electrode 33 are formed such that the source electrode 32 and the drain electrode 33 come in contact with the lower Mg-doped GaN layer 16.

In this embodiment, the substrate 11 is formed of a Si substrate, the first buffer layer 12 is formed of aluminum nitride (AlN), and the second buffer layer 13 is formed of aluminum gallium nitride (AlGaN). Further, the electron transit layer 14 serving as the first semiconductor layer is formed of i-GaN and the electron donation layer 15 serving as the second semiconductor layer is formed of i-AlGaN. In addition, the dielectric layer 21 is formed of a dielectric material containing oxides or nitrides. An example of such a material include $SiO_2$. The insulating film 22 may serve as a gate insulating film and may be formed of an insulator such as aluminum oxide by atomic layer deposition (ALD).

In this embodiment, the lower Mg-doped GaN layer 16 serving as a semiconductor cap layer includes a p-GaN region 16a and a high resistance region 16b. The p-GaN region 16a is formed directly beneath the gate electrode 31. Accordingly, the high resistance region 16b is formed in a region of the lower Mg-doped GaN layer 16 (i.e., the semiconductor cap layer) excluding a region directly beneath the gate electrode 31. Note that the impurity element Mg is activated and the activated Mg is a p-type in the p-GaN region 16a. Hence, the Mg is bonded to hydrogen in the high resistance region 16b such that the impurity element Mg is not activated. As a result, the high resistance region 16b has resistivity higher than that of the p-GaN region 16a. The upper Mg-doped GaN layer 17 serving as the third semiconductor layer is formed in the p-GaN region 16a of the lower Mg-doped GaN layer 16. Hence, the impurity element Mg is activated so that the activated Mg is a p-type. As a result, the high resistance region 16b has the density of hydrogen higher than that of the p-GaN region 16a of the lower Mg-doped GaN layer 16.

Accordingly, in the 2DEG 14a formed near the interface between the electron transit layer 14 and the electron donation layer 15, the electrons may be eliminated only from a region directly beneath the p-GaN region 16a without decreasing the density of electrons in a region directly beneath the high resistance region 16b. Accordingly, it may be possible to implement a normally-off status without increasing the on-resistance in the semiconductor device according to the first embodiment. Note that in this embodiment, the p-GaN region 16a and the upper Mg-doped GaN layer 17 formed directly beneath the gate electrode 31 are thicker than the high resistance region 16b. Hence, the electrons of the 2DEG directly beneath the gate electrode 31 may be reliably eliminated. Thus, it may be possible to more reliably implement a normally-off status with high uniformity without increasing the on-resistance in the semiconductor device according to the first embodiment.

Note that in this embodiment, the region directly beneath the p-GaN region 16a and the like includes a region lower than the electron donation layer 15. The region directly beneath the gate electrode 31 includes a region lower than the p-GaN region 16a and the electron donation layer 15.

(Fabrication Method of Semiconductor Device)

Next, a fabrication method of the semiconductor device according to the first embodiment is described with reference to FIGS. 3A to 3C and FIGS. 4A and 4B.

Figure 3A:
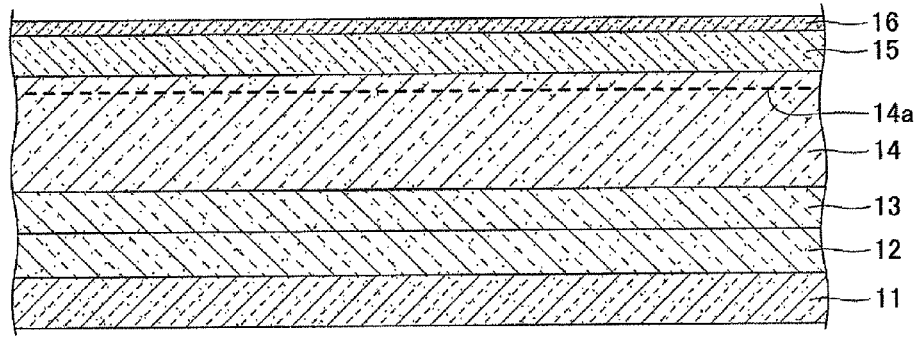
FIGS. 3A, 3B and 3C are process diagrams illustrating a fabrication method of the semiconductor device according to the first embodiment.

Initially, as illustrated in FIG. 3A, nitride semiconductor layers including the first buffer layer 12, the second buffer layer 13, the electron transit layer 14, the electron donation layer 15, and the lower Mg-doped GaN layer 16 are epitaxially grown by MOVPE on the substrate 11. In this embodiment, the first buffer layer 12 is formed of AlN having a thickness of approximately 200 nm, and the second buffer layer 13 is formed of AlGaN having a thickness of approximately 600 nm. Further, the electron transit layer 14 is formed of GaN having a thickness of approximately 1200 nm, and the electron donation layer 15 is formed of AlGaN having a thickness of approximately 20 nm. The lower Mg-doped GaN layer 16 has a thickness of approximately 3 nm.

When these nitride semiconductor layers are deposited by MOVPE, trimethylaluminum (TMA) is utilized as a source gas of Al, trimethylgallium (TMG) is utilized as a source gas of Ga, and ammonia (NH3) is utilized as a source gas of N. Further, cyclopentadienylmagnesium (Cp2Mg) is utilized as a source gas of Mg. Note that these source gases are supplied with hydrogen ($H_2$) as a carrier gas to a reactor of an MOVPE device.

Further, an ammonia gas for forming the nitride semiconductor layers is supplied at a flow rate range of 100 to 10000 sccm, and a growth pressure for forming the nitride semiconductor layers is applied at 50 to 300 Torr at a growth temperature range of 1000 to 1200° C.

The substrate 11 may be a sapphire substrate, a Si substrate, and a SiC substrate. In this embodiment, the SiC substrate is utilized as the substrate 11.

When the second buffer layer 13 is expressed as $Al_xGa_{1-x}N$, the second buffer layer 13 is formed such that the X value is 0.4. That is, the second buffer layer 13 is formed as $Al_{0.4}Ga_{0.6}N$.

When the electron donation layer 15 is expressed as $Al_xGa_{1-x}N$, the electron donation layer 15 is formed such that the X value is in a range of 0.1 to 0.3. In this embodiment, the electron donation layer 15 is formed such that the X value is 0.2. That is, the electron donation layer 15 is formed as $Al_{0.2}Ga_{0.8}N$. Further, the electron donation layer 15 may be i-AlGaN or n-AlGaN. Si is doped as an impurity element when the electron donation layer 15 is n-AlGaN. In this case, the Si is doped such that the concentration of Si is in a range of $1 \times 10^{18}$ cm$^{-3}$ to $1 \times 10^{20}$ cm$^{-3}$, such as $1 \times 10^{19}$ cm$^{-3}$. In this case, $SiH_4$ may serve as a source gas of Si.

The lower Mg-doped GaN layer 16 is formed of GaN to which Mg is doped as an impurity element at an impurity concentration range of $5 \times 10^{18}$ cm$^{-3}$ to $5 \times 10^{20}$ cm$^{-3}$. In this embodiment, the lower Mg-doped GaN layer 16 is formed such that Mg is doped in GaN as an impurity element at an impurity concentration of $1 \times 10^{19}$ cm$^{-3}$. Note that the lower Mg-doped GaN layer 16 immediately after being deposited contains hydrogen in its film. Hence, the hydrogen is bonded to Mg so that the Mg is not activated. As a result, the lower Mg-doped GaN layer 16 exhibits high resistivity.

Figure 3B:
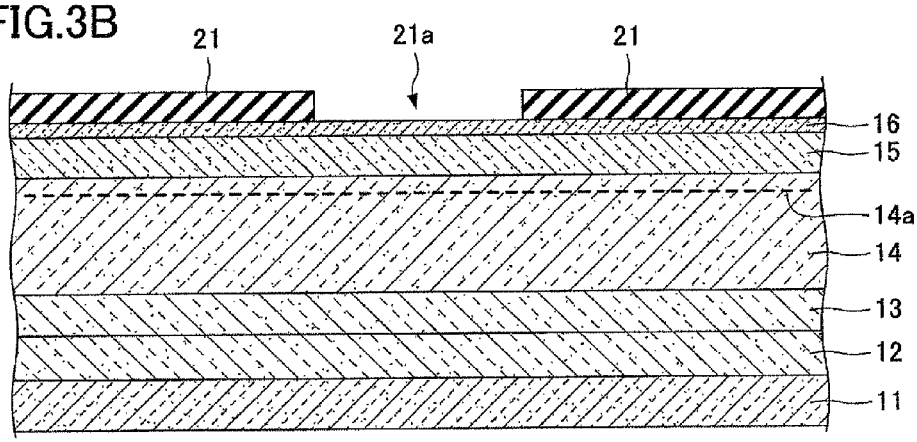

Next, as illustrated in FIG. 3B, a dielectric layer 21 is formed in a region excluding a region in which the gate electrode 31 is formed of a surface of the lower Mg-doped GaN layer 16. Specifically, the dielectric layer 21 such as $SiO_2$ is deposited on the surface of the lower Mg-doped GaN layer 16 by sputtering or the like such that the thickness of the dielectric layer 21 is approximately 200 nm. Subsequently, a not-illustrated photoresist is applied to the surface of the dielectric layer 21, and the photoresist applied dielectric layer 21 is then exposed to light for the development utilizing an exposure device, thereby forming a not-illustrated resist pattern having an opening corresponding to the region in which the gate electrode 31 is formed. Thereafter, the dielectric layer 21 is removed by wet etching or dry etching from a region, in which the resist pattern is not formed, of the surface of the lower Mg-doped GaN layer 16. As a result, the dielectric layer 21 having an opening 21a corresponding to the region in which the gate electrode 31 is formed utilizing $SiO_2$. The resist pattern is then removed with an organic solvent or the like. Note that the dielectric layer 21 may be formed of SiN or the like.

Figure 3C:
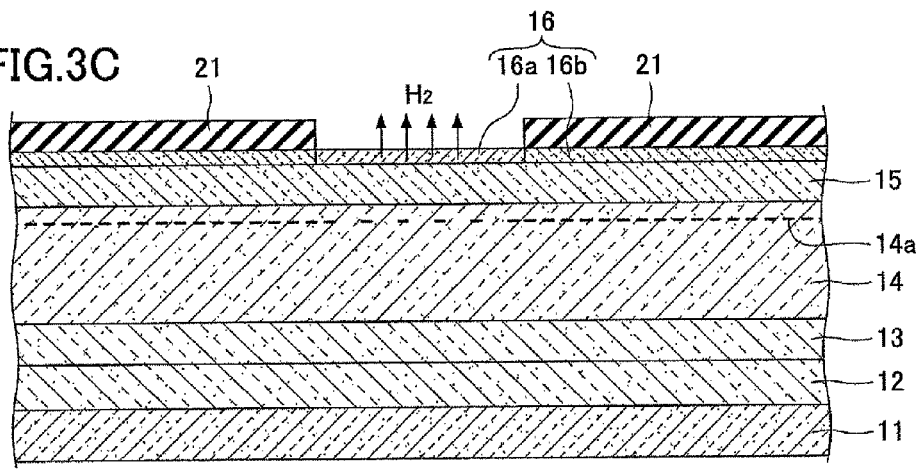

Next, as illustrated in FIG. 3C, the obtained product is heated at a temperature range of 400 to 1000° C. under the nitrogen atmosphere. Accordingly, a hydrogen component contained in the lower Mg-doped GaN layer 16 is discharged in a region of the surface of the lower Mg-doped GaN layer 16 corresponding to the opening 21a where the dielectric layer 21 is not formed. Hence, the region of the lower Mg-doped GaN layer 16 corresponding to the opening 21a is activated such that the region becomes a p-type. As a result, a p-GaN region 16a is formed. Note that in the region of the surface of the lower Mg-doped GaN layer 16 where the dielectric layer 21 is formed, the discharge of the hydrogen is inhibited by the dielectric layer 21. Hence, the hydrogen is not eliminated from the region of the lower Mg-doped GaN layer 16 where the dielectric layer 21 is formed. Accordingly, in dielectric layer 21 formed region of the lower Mg-doped GaN layer 16, the bonding of Mg and H is maintained such that the Mg is not activated. As a result, the high resistance region 16b is formed in the dielectric layer 21 formed region of the lower Mg-doped GaN layer 16. In this embodiment, the thickness of the lower Mg-doped GaN layer 16 is extremely thin as being approximately 3 nm. Accordingly, the crystal strain may be small and the internal field may be small. Hence, the hydrogen contained in the region of the lower Mg-doped GaN layer 16 corresponding to the opening 21a may be effectively eliminated via the opening 21a of the dielectric layer 21. Further, the thickness of the lower Mg-doped GaN layer 16 is extremely thin as being approximately 3 nm. Accordingly, the hydrogen contained in the lower Mg-doped GaN layer 16 may be eliminated only from the region of the lower Mg-doped GaN layer 16 corresponding to the opening 21a.

Accordingly, the interface between p-GaN region 16a and the high resistance region 16b may be formed at a predetermined position with high reproducibility. In view of the above, it may be preferable that the thickness of the Mg-doped GaN layer 16 be greater than or equal to 3 nm and less than or equal to 10 nm. Thus, the p-GaN region 16a is formed in a region of the lower Mg-doped GaN layer 16 in which the dielectric layer 21 is not formed, and the high resistance region 16b is formed a region of the lower Mg-doped GaN layer 16 excluding a region in which the dielectric layer 21 is formed. In this embodiment, the heat treatment is conducted by placing the dielectric layer 21 formed layer in the MOVPE device, and heating a chamber of the MOVPE being filled with a nitrogen atmosphere.

Figure 4A:
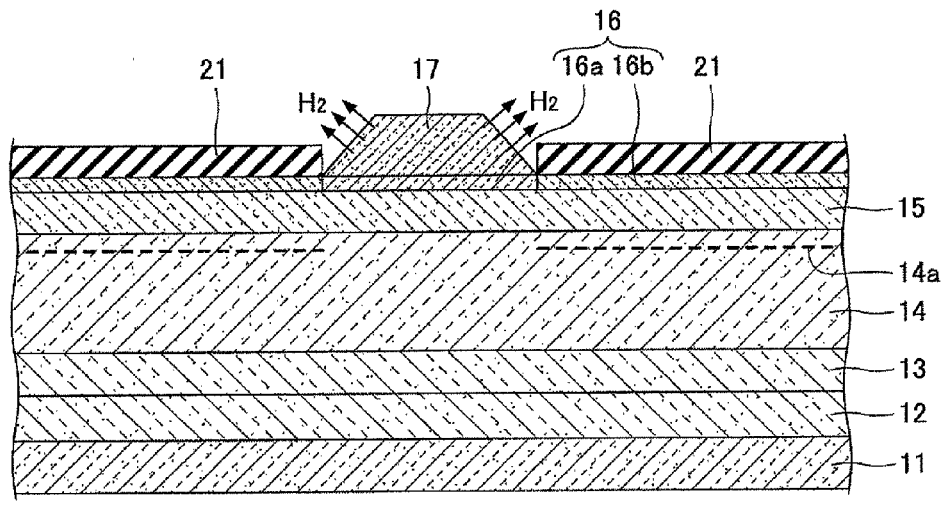
FIGS. 4A and 4B are process diagrams illustrating a fabrication method of the semiconductor device according to the first embodiment.

Next, as illustrated in FIG. 4A, the upper Mg-doped GaN layer 17 is formed in the p-GaN region 16a from which the lower Mg-doped GaN layer 16 is exposed. More specifically, since the upper Mg-doped GaN layer 17 is selectively formed by epitaxial growth by MOVPE, the crystal is grown only in the p-GaN region from which the lower Mg-doped GaN layer 16 is exposed and little crystal is grown on the dielectric layer 21. Hence, the upper Mg-doped GaN layer 17 is formed only in the p-GaN region 16a from which the lower Mg-doped GaN layer 16 is exposed. Note that the upper Mg-doped GaN layer 17 may be formed of GaN to which Mg is doped at an impurity concentration range of $5 \times 10^{18}$ cm$^{-3}$ to $5 \times 10^{20}$ cm$^{-3}$. In this embodiment, the upper Mg-doped GaN layer 17 is formed of GaN to which Mg is doped at an impurity concentration range of $1 \times 10^{18}$ cm$^{-3}$.

Thereafter, the upper Mg-doped GaN layer 17 is heated under the nitrogen atmosphere to eliminate hydrogen, which may activate the upper Mg-doped GaN layer 17 to be the p-type. In the upper Mg-doped GaN layer 17, hydrogen may be eliminated from a direction lateral to its film surface that generates no internal field. That is, hydrogen may be eliminated from a film thickness direction of the upper Mg-doped GaN layer 17. Accordingly, a larger amount of hydrogen may be efficiently eliminated.

It is preferable that the thickness range of the upper Mg-doped GaN layer 17 be 50 to 200 nm. In this embodiment, the thickness of the upper Mg-doped GaN layer 17 is approximately 50 nm. It is preferable that the upper Mg-doped GaN layer 17 be formed such that the upper Mg-doped GaN layer 17 has a sufficient thickness to supply a larger amount of holes. Further, it is preferable that the upper Mg-doped GaN layer 17 be formed thicker than the lower Mg-doped GaN layer 16. In this embodiment, the heat treatment and the deposition of the upper Mg-doped GaN layer 17 may be successively performed within the same chamber of the MOVPE device. Hence, it may be possible to prevent particles from being attached to the p-GaN region 16a in which the upper Mg-doped GaN layer 17 is grown.

Figure 4B:
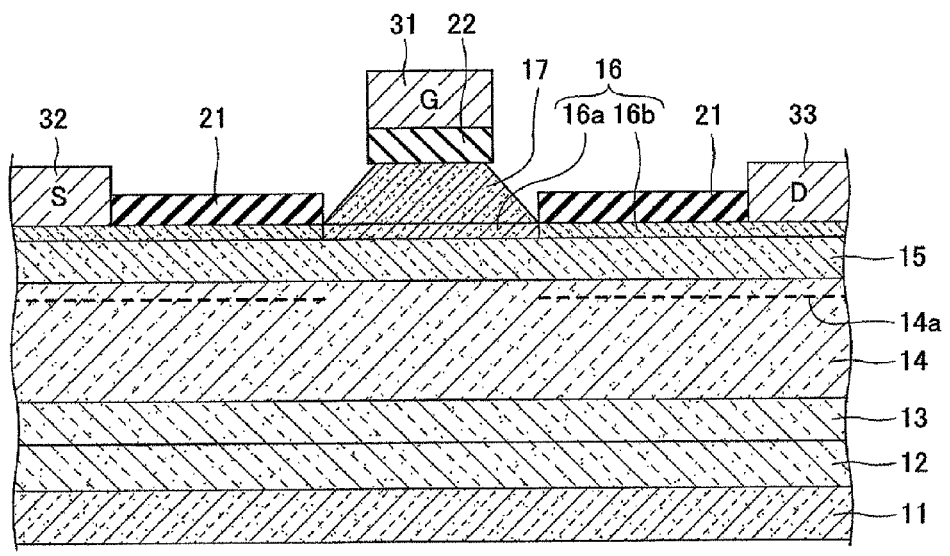

Next, as illustrated in FIG. 4B, an insulating film 22 serving as a gate insulating film is formed on the upper Mg-doped GaN layer 17 and a gate electrode 31 is formed on the insulating film 22. Further, the dielectric layer 21 is removed from respective regions in which the source electrode 32 and the drain electrode 33 are formed, and the source electrode 32 and the drain electrode 33 are formed in the respective regions from which the dielectric layer 21 is removed.

Figure 5:
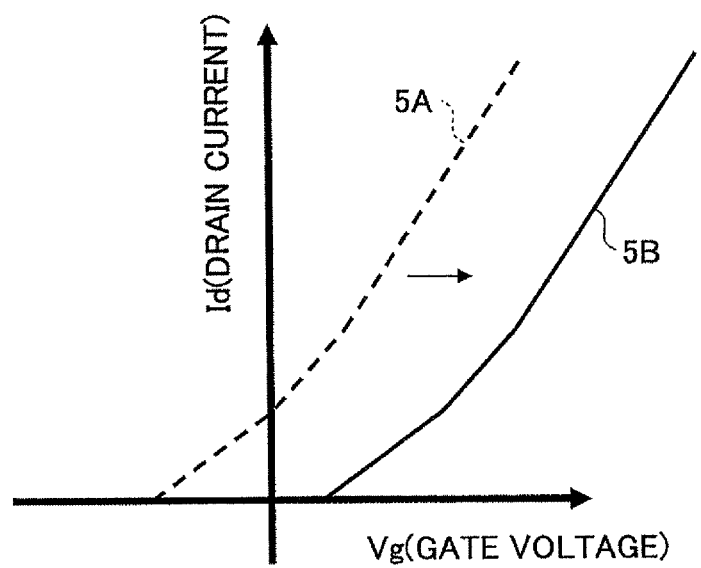
FIG. 5 is a characteristics diagram illustrating a gate voltage and a drain current of the semiconductor device according to the first embodiment.

The semiconductor device according to the first embodiment may thus be fabricated in the above-described processes. In the semiconductor device according to the first embodiment, the upper Mg-doped GaN layer 17 and the p-GaN region 16a of the lower Mg-doped GaN layer 16 are activated in a region via the insulating film 22 directly beneath the gate electrode 31, and hence, it may be possible to generate numerous holes. Accordingly, the electrons of 2DEG 14a may be eliminated in a region directly beneath the gate electrode 31, and the gate voltage may be shifted in a positive side as illustrated in FIG. 5, and as result, the semiconductor device according to the first embodiment may be configured to be in a normally-off status. Note that in FIG. 5, a broken line 5A indicates a characteristic of the structure HEMT illustrated in FIG. 1 whereas a solid line 53 indicates a characteristic of the structure HEMT according to this embodiment illustrated in FIG. 2.

In this embodiment, the high resistance region 16b of the lower Mg-doped GaN layer 16 exhibits high resistivity. Hence, the electrons of the 2DEG 14a may be prevented from being reduced in a region directly beneath the high resistance region 16b, and the on-resistance may be prevented from being increased. Further, the p-type upper Mg-doped GaN layer 17, the p-GaN region 16a and the high resistance region 16b have different thicknesses such that the boundaries between them may be clearly defined. Accordingly, the semiconductor device according to the first embodiment may exhibit high yield and superior uniformity.

Note that in the heat treatment illustrated in FIG. 3C, when the lower Mg-doped GaN layer 16 is thin, the amount of holes supplied may be similar. Accordingly, it may be possible to obtain a semiconductor device that exhibits similar uniformity without carrying out the heat treatment.

Figure 6:
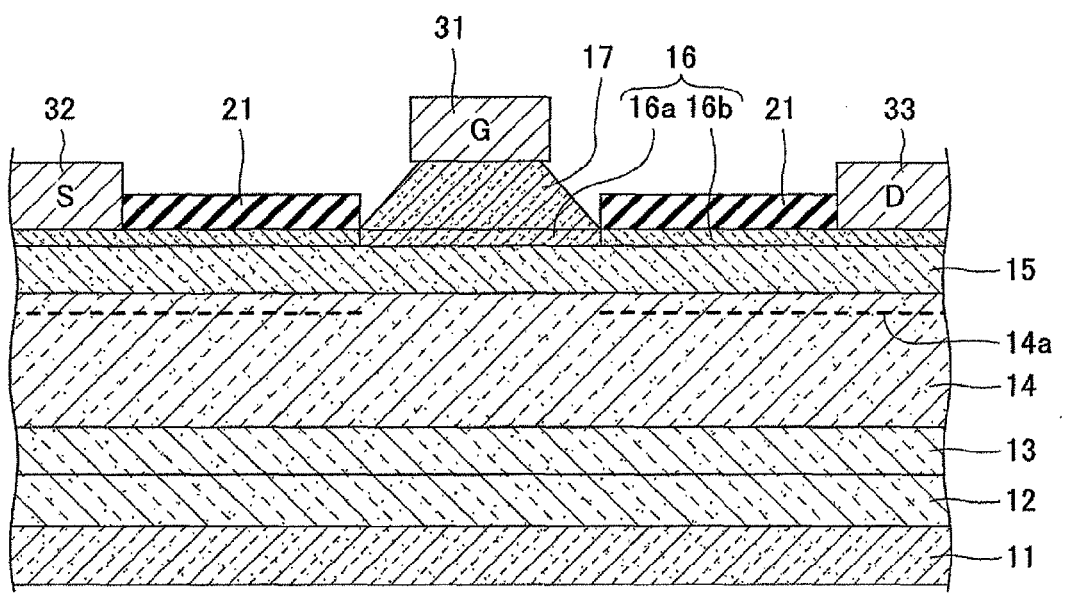
FIG. 6 is a structural diagram illustrating another semiconductor device according to the first embodiment.

Further, the above-described first embodiment describes the semiconductor device having a structure including the insulating film 22; however, the semiconductor device according to the first embodiment may have a structure without the insulating film 22 as illustrated in FIG. 6. Specifically, the semiconductor device having the structure without the insulating film 22 may be formed by forming the structure having the upper Mg-doped GaN layer 17 illustrated in FIG. 4A and subsequently forming the gate electrode 31 on the upper Mg-doped GaN layer 17 without forming the insulating film 22.

Second Embodiment

Semiconductor Device

Figure 7:
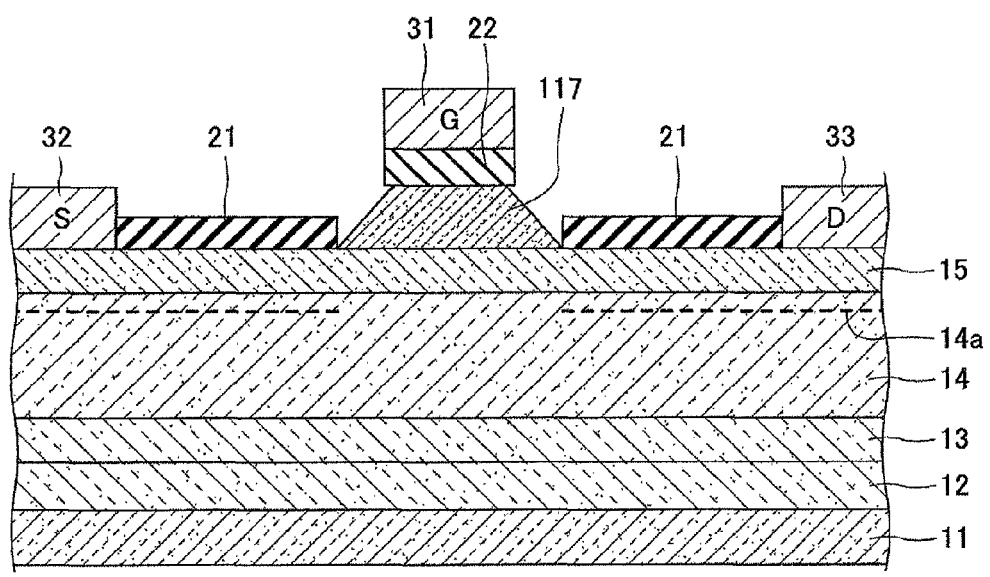
FIG. 7 is a structural diagram illustrating a semiconductor device according to a second embodiment.

Next, a second embodiment is described. As illustrated in FIG. 7, a semiconductor device according to the second embodiment includes a first buffer layer 12, a second buffer layer 13, an electron transit layer 14 serving as a first semiconductor layer and an electron donation layer 15 serving as a second semiconductor layer that are sequentially formed on a substrate 11. An upper Mg-doped GaN layer 117 is formed of a p-type impurity-doped nitride semiconductor layer and serves as the third semiconductor layer. The upper Mg-doped GaN layer 117 is formed on the electron donation layer 15 directly beneath the gate electrode 31. Further, a dielectric layer 21 is formed in a region of the electron donation layer 15 excluding a region in which the upper Mg-doped GaN layer 117 is formed. The gate electrode 31 is formed on the upper Mg-doped GaN layer 117 via an insulating film 22. The source electrode 32 and the drain electrode 33 are formed such that the source electrode 32 and the drain electrode 33 come in contact with the electron donation layer 15.

In this embodiment, the substrate 11 is formed of a Si substrate, the first buffer layer 12 is formed of aluminum nitride (AlN), and the second buffer layer 13 is formed of aluminum gallium nitride (AlGaN). Further, the electron transit layer 14 serving as the first semiconductor layer is formed of i-GaN and the electron donation layer 15 serving as the second semiconductor layer is formed of i-AlGaN. In addition, the dielectric layer 21 is formed of a dielectric material containing oxides or nitrides. An example of such a material include $SiO_2$. The insulating film 22 serving as a gate insulating film may be formed of an insulator such as aluminum oxide by atomic layer deposition (ALD).

In the second embodiment, the upper Mg-doped GaN layer 117 serving as the third semiconductor layer is formed in a region directly beneath the gate electrode 31. Hence, the impurity element Mg is activated so that the activated Mg is a p-type. Accordingly, the 2DEG 14a is formed near the interface between the electron transit layer 14 and the electron donation layer 15, and the electrons may be eliminated only from a region of the electron transit layer 14 directly beneath the upper Mg-doped GaN layer 117. That is, the electrons of the 2DEG 14a may be eliminated only from a region directly beneath a region in which the upper Mg-doped GaN layer 117 is formed without reducing the density of electrons in the region directly beneath a region in which the upper Mg-doped layer 117 is not formed. Accordingly, the semiconductor device according to the second embodiment may be configured to be in a normally-off status without increasing the on-resistance.

In the semiconductor device according to the second embodiment, the p-type Mg-doped GaN layer 117 is formed directly beneath the gate electrode 31. Further, although the dielectric layer 21 is formed in a region excluding the region in which the gate electrode 31 is formed, a p-type region is unformed. Hence, the electrons of the 2DEG 14a directly beneath the gate electrode 31 may be reliably eliminated. Thus, it may be possible to more reliably implement a normally-off status with high uniformity without increasing the on-resistance in the semiconductor device according to the second embodiment.

(Fabrication Method of Semiconductor Device)

Next, a fabrication method of the semiconductor device according to the first embodiment is described with reference to FIGS. 8A to 8C and FIG. 9.

Figure 8A:
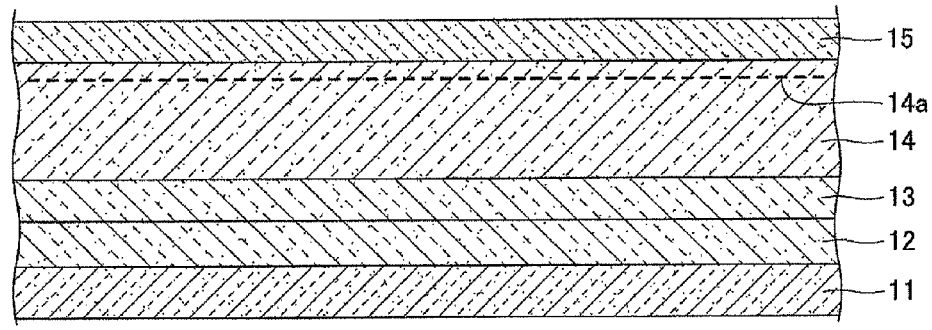
FIGS. 8A, 8B and 8C are process diagrams illustrating a fabrication method of the semiconductor device according to the second embodiment.

Initially, as illustrated in FIG. 8A, the first buffer layer 12, the second buffer layer 13, the electron transit layer 14 and the electron donation layer 15, and the lower Mg-doped GaN layer 16 are epitaxially grown on the substrate 11 by MOVPE. In this embodiment, the first buffer layer 12 is formed of AlN having a thickness of approximately 200 nm, and the second buffer layer 13 is formed of AlGaN having a thickness of approximately 600 nm. Further, the electron transit layer 14 is formed of GaN having a thickness of approximately 1200 nm, and the electron donation layer 15 is formed of AlGaN having a thickness of approximately 20 nm.

When these nitride semiconductor layers are deposited by MOVPE, trimethylaluminum (TMA) is utilized as a source gas of Al, trimethylgallium (TMG) is utilized as a source gas of Ga, ammonia (NH3) is utilized as a source gas of N. Further, cyclopentadienylmagnesium (Cp2Mg) is utilized as a source gas of Mg. Note that these source gases are supplied with hydrogen ($H_2$) as a carrier gas to a reactor of an MOVPE device.

Further, an ammonia gas for forming the nitride semiconductor layers is supplied at a flow rate range of 100 to 10000 sccm, and a growth pressure for forming the nitride semiconductor layers is applied at 50 to 300 Torr at a growth temperature range of 1000 to 1200° C.

The substrate 11 may be a sapphire substrate, a Si substrate, and a SiC substrate. In this embodiment, the SiC substrate is utilized as the substrate 11.

When the second buffer layer 13 is expressed as $Al_xGa_{1-x}N$, the second buffer layer 13 is formed such that the X value is 0.4. That is, the second buffer layer 13 is formed as $Al_{0.4}Ga_{0.6}N$.

When the electron donation layer 15 is expressed as $Al_xGa_{1-x}N$, the electron donation layer 15 is formed such that the X value is in a range of 0.1 to 0.3. In this embodiment, the electron donation layer 15 is formed such that the X value is 0.2. That is, the electron donation layer 15 is formed as $Al_{0.2}Ga_{0.8}N$. Further, the electron donation layer 15 may be i-AlGaN or n-AlGaN. Si is doped as an impurity element when the electron donation layer 15 is n-AlGaN. In this case, the Si is doped such that the concentration of Si is in a range of $1\times10^{18}$ cm$^{-3}$ to $1\times10^{20}$ cm$^{-3}$, such as $1\times10^{19}$ cm$^{-3}$. In this case, $SiH_4$ may serve as a source gas of Si.

Figure 8B:
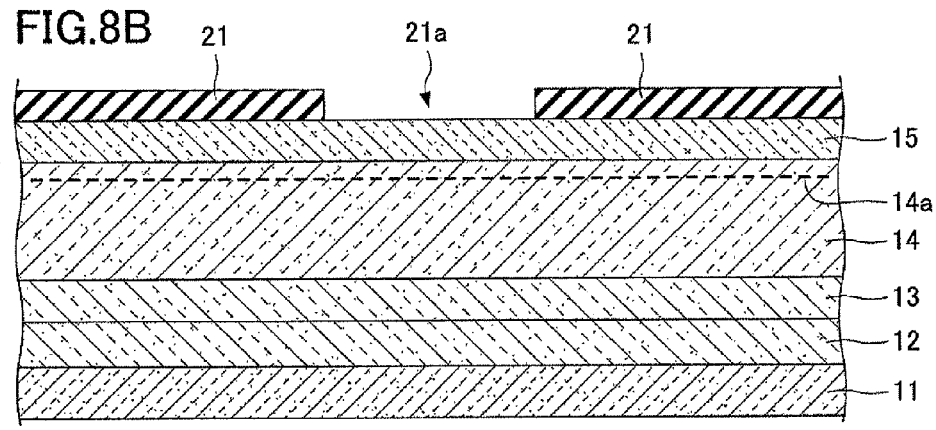

Next, as illustrated in FIG. 8B, a dielectric layer 21 is formed in a region of a surface of the electron donation layer 15 excluding a region in which the gate electrode 31 is formed. Specifically, the dielectric layer 21 such as $SiO_2$ is deposited on the surface of the electron donation layer 15 by sputtering or the like such that the thickness of the dielectric layer 21 is approximately 200 nm. Subsequently, a not-illustrated photoresist is applied to the surface of the dielectric layer 21, and the photoresist applied dielectric layer 21 is then exposed to light for the development utilizing an exposure device, thereby forming a not-illustrated resist pattern having an opening corresponding to the region in which the gate electrode 31 is formed. Thereafter, the dielectric layer 21 is removed by wet etching or dry etching from a region, in which the resist pattern is not formed, of the surface of the electron donation layer 15. As a result, the dielectric layer 21 having an opening 21a corresponding to the region in which the gate electrode 31 is formed utilizing $SiO_2$. Then, the resist pattern is removed with an organic solvent, or the like. Note that the dielectric layer 21 may be formed of SiN or the like.

Figure 8C:
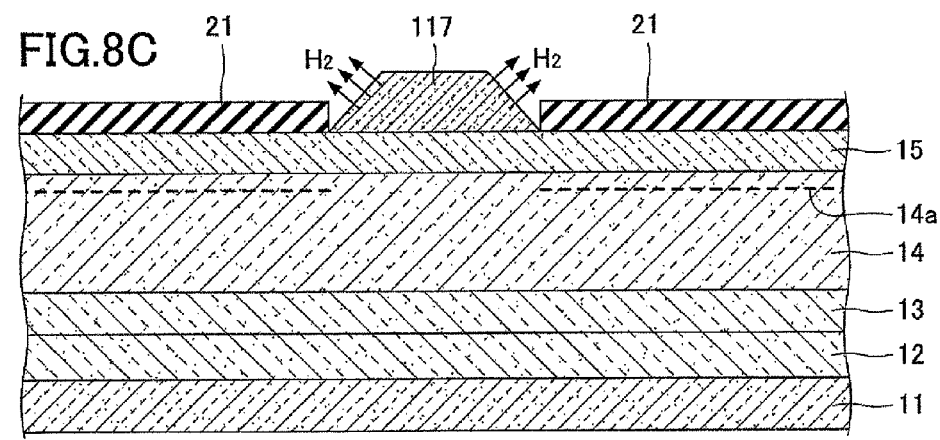

Next, as illustrated in FIG. 8C, the Mg-doped GaN layer 117 is formed in a region from which the electron donation layer 15 is exposed corresponding to the opening 21a of the dielectric 21. More specifically, since the Mg-doped GaN layer 117 is selectively formed by epitaxial growth by MOVPE, the crystal is grown only in a region corresponding to the opening 21a of the dielectric layer 21 from which of the electron donation layer 15 is exposed and little crystal is grown on the dielectric layer 21. Hence, the Mg-doped GaN layer 117 may be formed only in the region from which the electron donation layer 15 is exposed. Note that the Mg-doped GaN layer 117 may be formed of GaN to which Mg is doped at an impurity concentration range of $5\times10^{18}$ cm$^{-3}$ to $5\times10^{20}$ cm$^{-3}$. In this embodiment, the Mg-doped GaN layer 117 is formed of GaN to which Mg is doped at an impurity concentration range of $1\times10^{18}$ cm$^{-3}$.

Thereafter, the Mg-doped GaN layer 117 is heated under the nitrogen atmosphere to eliminate hydrogen, which may activate the Mg-doped GaN layer 117 to be the p-type. In the Mg-doped GaN layer 117, hydrogen may be eliminated from a direction lateral to its film surface that generates no internal field. That is, hydrogen may be eliminated from a film thickness direction of the Mg-doped GaN layer 17. Accordingly, a larger amount of hydrogen may be efficiently eliminated. Note that it is preferable that the thickness range of the Mg-doped GaN layer 117 be in a range of 50 to 200 nm. In this embodiment, the thickness of the upper Mg-doped GaN layer 17 is approximately 50 nm.

Figure 9:
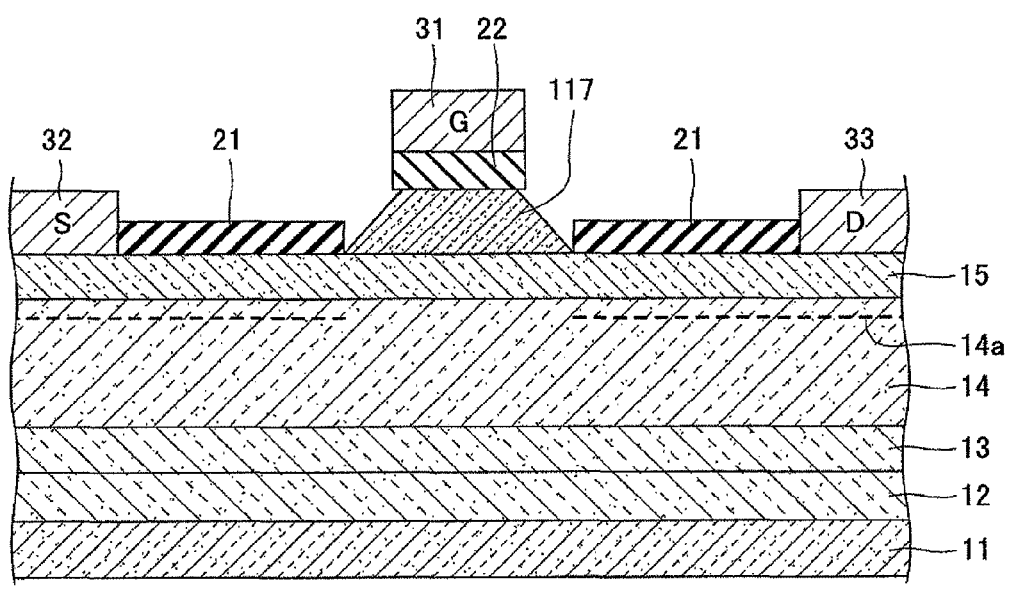
FIG. 9 is a process diagram illustrating the fabrication method of the semiconductor device according to the second embodiment.

Next, as illustrated in FIG. 9, an insulating film 22 serving as a gate insulating film is formed on the Mg-doped GaN layer 117 and a gate electrode 31 is formed on the insulating film 22. Further, the dielectric layer 21 is removed from respective regions in which the source electrode 32 and the drain electrode 33 are formed, and the source electrode 32 and the drain electrode 33 are formed in the respective regions from which the dielectric layer 21 is removed.

The semiconductor device according to the second embodiment is thus fabricated in the above-described processes. In the semiconductor device according to the second embodiment, the Mg-doped GaN layer 117 is activated in a region via the insulating film 22 directly beneath the gate electrode 31, and hence, it may be possible to generate numerous holes. Accordingly, the electrons of 2DEG 14a may be eliminated in a region directly beneath the gate electrode 31, and the gate voltage may be shifted in a positive side. As a result, the semiconductor device according to the second embodiment may be configured to be in a normally-off status. Further, the Mg-doped GaN layer 117 is not formed in a region excluding the region directly beneath the gate electrode 31. Hence, the electrons of the 2DEG 14a in the region directly beneath the gate electrode 31 may be prevented from being reduced, and the on-resistance may be prevented from being increased. In the semiconductor device according to the second embodiment, the p-type Mg-doped GaN layer 117 is formed in a region directly beneath the gate electrode 31. Hence, the boundary of a region in which the p-type Mg-doped GaN layer 117 is unformed may be clearly defined. As a result, the uniformity of the fabricated semiconductor device may be improved and the yield of the fabricated semiconductor device may be increased.

Further, the above-described second embodiment describes the semiconductor device having a structure including the insulating film 22; however, the semiconductor device according to the second embodiment may have a structure without the insulating film 22. Specifically, the semiconductor device having the structure without the insulating film 22 may be formed by forming the structure including the Mg-doped GaN layer 117 illustrated in FIG. 8C and subsequently forming the gate electrode 31 on the Mg-doped GaN layer 117 without forming the insulating film 22.

Note that other configurations and features of the semiconductor device according to the second embodiment are similar to those of the semiconductor device according to the first embodiment.

Third Embodiment

Next, a third embodiment is described. The third embodiment describes a semiconductor package, a power supply unit and a high-frequency amplifier.

Figure 10:
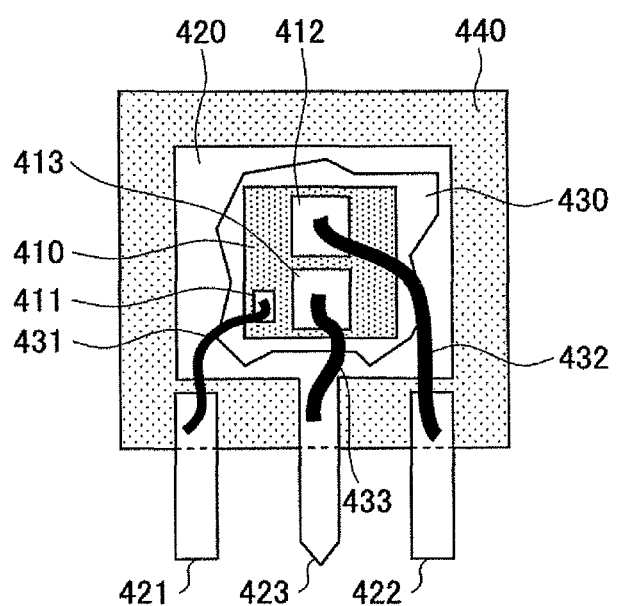
FIG. 10 is an explanatory diagram illustrating a discrete semiconductor package according to a third embodiment.

The semiconductor package according to the third embodiment includes a discrete package of the semiconductor device according to the first embodiment or the second embodiment, that is, the discretely packaged semiconductor package. Hence, the discretely packaged semiconductor package is described with reference to FIG. 10. Note that FIG. 10 schematically illustrates an internal configuration of the discretely packaged semiconductor package. Hence, arrangement of the electrode or the like in the configuration of the discretely packaged semiconductor package may differ from that of the semiconductor device according to the first embodiment or the second embodiment.

Initially, a high electron mobility transistor (HEMT) semiconductor chip 410 made of a GaN semiconductor material may be formed by dicing the semiconductor device fabricated in the first embodiment or the second embodiment. The semiconductor chip 410 is fixed onto a lead frame 420 with a die-attach adhesive 430 such as solder. Note that the semiconductor chip 410 corresponds to the semiconductor device according to the first embodiment or the second embodiment.

Subsequently, a gate electrode 411 is connected to a gate lead 421 with a bonding wire 431. A source electrode 412 is connected to a source lead 422 with a bonding wire 432. A drain electrode 413 is connected to a drain lead 423 with a bonding wire 433. Note that the bonding wires 431, 432 and 433 are formed of a metallic material such as aluminum (Al). Further, in the semiconductor package according to the third embodiment, the gate electrode 411 is a gate electrode pad, which is connected to the gate electrode 31 of the semiconductor device according to the first embodiment or the second embodiment. Further, the source electrode 412 is a source electrode pad, which is connected to the source electrode 32 of the semiconductor device according to the first embodiment or the second embodiment. In addition, the drain electrode 413 is a drain electrode pad, which is connected to the drain electrode 33 of the semiconductor device according to the first embodiment or the second embodiment.

Subsequently, the obtained product is sealed by plastic molding such as transfer molding with mold resin 440. Accordingly, the discretely packaged HEMT semiconductor package utilizing the GaN semiconductor material is fabricated.

Next, a power supply unit and a high-frequency amplifier according to the third embodiment is described. The power supply unit and the high-frequency amplifier in the third embodiment are the power supply unit and the high-frequency amplifier utilizing the semiconductor device in the first embodiment or the second embodiment.

Figure 11:
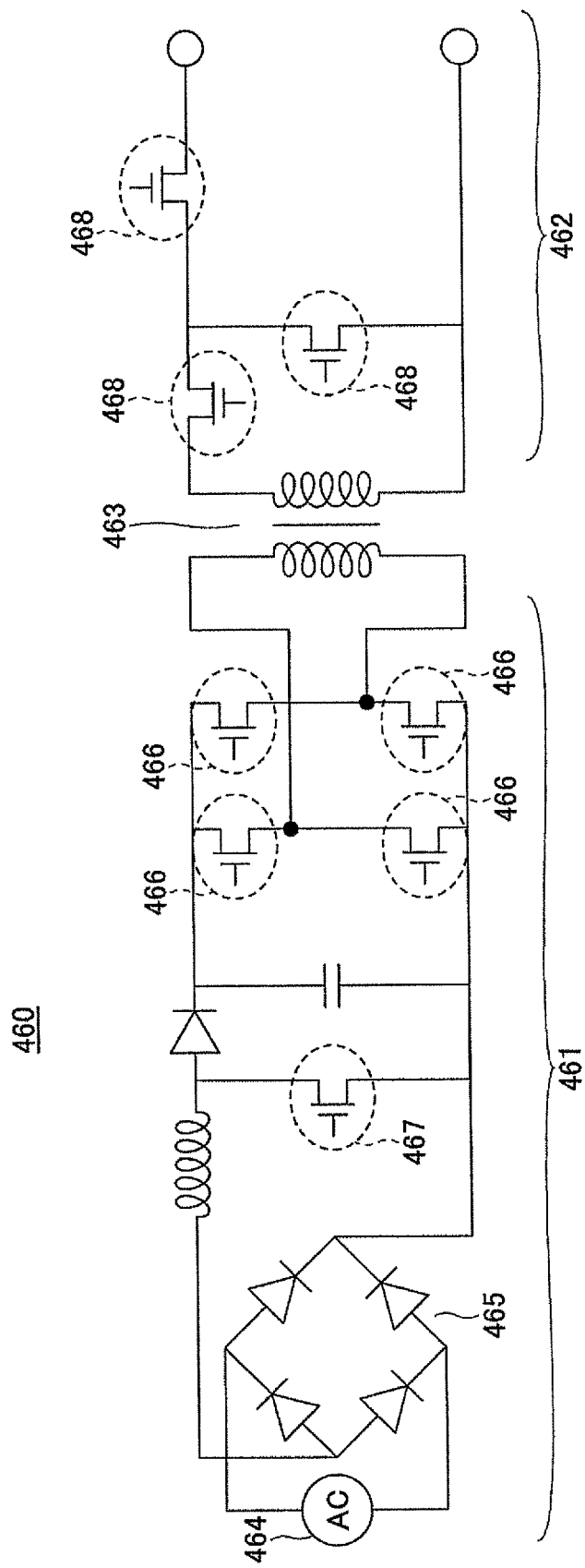
FIG. 11 is a circuit diagram of a power supply unit according to the third embodiment.

Initially, the power supply unit in the third embodiment is described with reference to FIG. 11. The power supply unit 460 in the third embodiment includes a high-voltage primary circuit 461, a low-voltage secondary circuit 462 and a transformer 463 arranged between the primary circuit 461 and the secondary circuit 462. The primary circuit 461 includes an alternating-current (AC) power supply 464, a so-called "bridge rectifier circuit" 465, plural switching elements (four switching elements in the example of FIG. 11) 466 and a switching element 467. The secondary circuit 462 includes plural switching elements (three switching elements in the example of FIG. 11) 468. In the example of FIG. 11, the semiconductor device according to the first embodiment or the second embodiment is utilized as the switching elements 466 and also as the switching element 467 of the primary circuit 461. Note that it is preferable that the switching elements 466 and the switching element 467 of the primary circuit 461 be normally-off semiconductor devices. Further, the switching elements utilized in the secondary circuit 462 employs an ordinary metal insulator semiconductor field-effect transistor (MISFET) formed of silicon.

Figure 12:
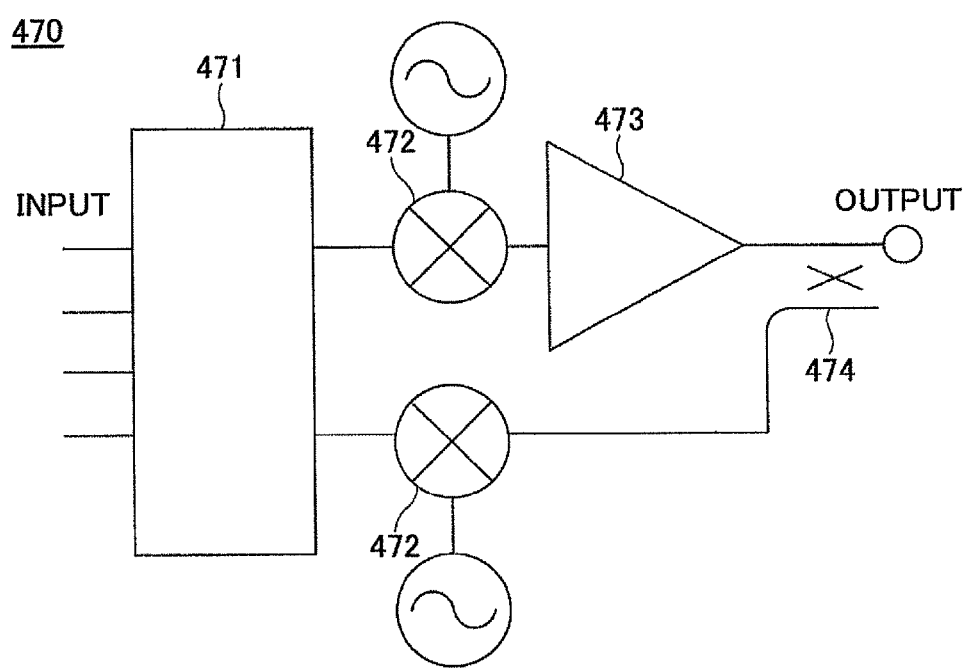
FIG. 12 is a structural diagram illustrating a high-power amplifier according to the third embodiment.

Next, the high-frequency amplifier in the third embodiment is described with reference to FIG. 12. The high-frequency amplifier 470 in the third embodiment may be applied as a power amplifier of a mobile phone base station. The high-frequency amplifier 470 includes a digital predistortion circuit 471, a mixer 472, a power amplifier 473 and a directional coupler 474. The digital predistortion circuit 471 is configured to compensate non-linear strain of an input signal. The mixer 472 is configured to mix the input signal of which the non-linear strain is compensated with an alternating current (AC) signal. The power amplifier 473 is configured to amplify the input signal mixed with the AC signal. In the example of FIG. 12, the power amplifier 473 includes the semiconductor device according to the first embodiment or the second embodiment. The directional coupler 474 is configured to monitor the input signal or output signal. In the circuit illustrated in FIG. 12, the mixer 472 may mix the output signal with the AC signal and supply the mixed signal of the output signal and the AC signal to the digital predistortion circuit 471.

According to the disclosures, the semiconductor device utilizing a nitride semiconductor such as GaN or the like as a semiconductor material and the method for fabricating such a semiconductor device may be capable of exhibiting high uniformity and a normally-off status without increasing the on-resistance.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of superiority or inferiority of the invention. Although the embodiments of the present inventions have been described in detail, it should be understood that the various changes, substitutions, and alterations could be made hereto without departing from the spirit and scope of the invention.

What is claimed is:

1. A method for fabricating a semiconductor device, the method comprising:
    sequentially forming a first semiconductor layer, a second semiconductor layer and a semiconductor cap layer containing a p-type impurity element on a substrate;
    forming a dielectric layer having an opening after the forming of the semiconductor cap layer;
    forming a third semiconductor layer containing a p-type impurity element on the semiconductor cap layer exposed from the opening of the dielectric layer;
    forming a gate electrode on the third semiconductor layer; and
    conducting a heat treatment under a nitrogen atmosphere after the forming of the dielectric layer,
    wherein the third semiconductor layer is formed after the heat treatment has been conducted under the nitrogen atmosphere.

2. The method as claimed in claim 1, further comprising:
    forming an insulating layer on the third semiconductor layer,
    wherein the gate electrode is formed on the third semiconductor layer via the insulating film.

3. The method as claimed in claim 1, wherein the p-type impurity element is magnesium (Mg).

4. The method as claimed in claim 1, wherein the third semiconductor layer is formed by metal organic vapor phase epitaxy (MOVPE).

5. A method for fabricating a semiconductor device, the method comprising:
    sequentially forming a first semiconductor layer, a second semiconductor layer and a semiconductor cap layer containing a p-type impurity element on a substrate;
    forming a dielectric layer having an opening after the forming of the semiconductor cap layer;
    forming a third semiconductor layer containing a p-type impurity element on the semiconductor cap layer exposed from the opening of the dielectric layer; and
    forming a gate electrode on the third semiconductor layer,
    wherein the forming of the third semiconductor layer includes depositing the third semiconductor layer, and conducting heat treatment under a nitrogen atmosphere after the third semiconductor layer has been deposited.

6. The method as claimed in claim 5, further comprising:
    forming an insulating layer on the third semiconductor layer,
    wherein the gate electrode is formed on the third semiconductor layer via the insulating film.

7. The method as claimed in claim 5, wherein the p-type impurity element is magnesium (Mg).

8. The method as claimed in claim 5, wherein the third semiconductor layer is formed by metal organic vapor phase epitaxy (MOVPE).

* * * * *